United States Patent
Kawamura

(10) Patent No.: US 11,653,511 B2
(45) Date of Patent: May 16, 2023

(54) ORGANIC EL LIGHT-EMITTING APPARATUS AND ELECTRONIC INSTRUMENT

(71) Applicant: IDEMITSU KOSAN CO., LTD., Chiyoda-ku (JP)

(72) Inventor: Yuichiro Kawamura, Sodegaura (JP)

(73) Assignee: IDEMITSU KOSAN CO., LTD., Chiyoda-ku (JP)

( * ) Notice: Subject to any disclaimer, the term of this patent is extended or adjusted under 35 U.S.C. 154(b) by 0 days.

(21) Appl. No.: 15/550,069

(22) PCT Filed: Feb. 5, 2016

(86) PCT No.: PCT/JP2016/053593
§ 371 (c)(1),
(2) Date: Aug. 10, 2017

(87) PCT Pub. No.: WO2016/129536
PCT Pub. Date: Aug. 18, 2016

(65) Prior Publication Data
US 2018/0019428 A1    Jan. 18, 2018

(30) Foreign Application Priority Data
Feb. 13, 2015   (JP) .............................. JP2015-027014

(51) Int. Cl.
*H10K 50/11*   (2023.01)
*H10K 50/16*   (2023.01)
(Continued)

(52) U.S. Cl.
CPC ............. *H10K 50/11* (2023.02); *H10K 50/13* (2023.02); *H10K 50/131* (2023.02); *H10K 50/15* (2023.02);
(Continued)

(58) Field of Classification Search
CPC ............. H01L 51/5028; H01L 51/5004; H01L 2251/5376; H01L 27/3211
See application file for complete search history.

(56) References Cited

U.S. PATENT DOCUMENTS

2008/0157657 A1* 7/2008 Matsunami ............... C09B 6/00
                                                       313/504
2012/0248968 A1* 10/2012 Ogiwara .............. C09K 11/025
                                                       313/504
(Continued)

FOREIGN PATENT DOCUMENTS

JP      10-153967 A    6/1998
JP      2008-159778 A  7/2008
(Continued)

OTHER PUBLICATIONS

International Search Report dated May 10, 2016 in PCT/JP2016/053593 filed Feb. 5, 2016.
(Continued)

*Primary Examiner* — Telly D Green
(74) *Attorney, Agent, or Firm* — Oblon, McClelland, Maier & Neustadt, L.L.P.

(57) ABSTRACT

Disclosed herein is an organic EL light-emitting apparatus including a plurality of pixels including a first pixel and a second pixel. The first pixel and second pixel share a common layer. The pixel other than the second pixel includes a non-common layer. The common layer contains a delayed fluorescent compound. The second pixel is configured to emit a light from the common layer. The pixel other than the second pixel is configured to emit a light from the non-common layer.

16 Claims, 5 Drawing Sheets

(51) Int. Cl.
  *H10K 50/15* (2023.01)
  *H10K 50/13* (2023.01)
  *H10K 59/35* (2023.01)
  *C09K 11/06* (2006.01)
  *H10K 50/18* (2023.01)

(52) U.S. Cl.
  CPC .............. *H10K 50/16* (2023.02); *H10K 59/35* (2023.02); *C09K 11/06* (2013.01); *H10K 50/18* (2023.02); *H10K 2101/40* (2023.02)

(56) References Cited

U.S. PATENT DOCUMENTS

2013/0306945 A1* 11/2013 Seo ..................... H01L 51/5016 257/40
2015/0155515 A1*  6/2015 Kim ..................... H01L 51/5016 257/40
2016/0329512 A1* 11/2016 Nishide ............... H01L 51/5028

FOREIGN PATENT DOCUMENTS

JP  2014-199857 A  10/2014
WO  2012/157211 A1  11/2012
WO  2014/157619 A1  10/2014

OTHER PUBLICATIONS

M. A. Baldo et al., "High-efficiency fluorescent organic light-emitting devices using a phosphorescent sensitizer", Nature, Feb. 17, 2000, vol. 403, pp. 750-753.

Takahiro Higuchi et al., "High-Efficiency White Organic Light-Emitting Diodes Based on a Blue Thermally Activated Delayed Fluorescent Emitter Combined with Green and Red Fluorescent Emitters", Advanced Materials, 2013, 12 total pages.

Hiroki Uoyama et al., "Highly efficient organic light-emitting diodes from delayed fluorescence", Nature, Dec. 13, 2012, vol. 492, 7 total pages.

* cited by examiner

ORGANIC EL LIGHT-EMITTING APPARATUS AND ELECTRONIC INSTRUMENT

TECHNICAL FIELD

The present invention relates to an organic EL light-emitting apparatus and an electronic device.

BACKGROUND ART

A light-emitting apparatus usable for a display is typically exemplified by a liquid crystal display. However, in recent years, an organic EL light-emitting apparatus using an organic electroluminescence device (hereinafter, occasionally abbreviated as an organic EL device) has been practically used as a new type of the light-emitting apparatus. The organic EL device includes an emitting zone (in which an emitting layer is included) between an anode and a cathode and emits light using exciton energy generated by a recombination of holes and electrons that have been injected into the emitting layer.

The light-emitting apparatus used for a color display is exemplified by a three-color light-emitting apparatus. In the three-color light-emitting apparatus, a color display is obtained by forming devices capable of respectively emitting light in three primary colors of red (R), green (G) and blue (B) and controlling a luminous intensity of each of the devices in the three colors.

For instance, Patent Literature 1 discloses an organic EL light-emitting apparatus including: transparent red, green and blue pixel electrodes; red and green organic emitting layers respectively formed only on the red and green pixel electrodes; a blue emitting layer formed entirely over the blue pixel electrode and the red and green organic emitting layers; and an opposing electrode formed on the blue emitting layer. In the organic EL light-emitting apparatus of Patent Literature 1, each of the red, green and blue emitting layers contains a fluorescent compound.

Patent Literature 2 discloses that a highly efficient organic EL multi-color light-emitting apparatus is obtainable by providing adjacent layer(s) formed of a material capable of serving as an electron transporting layer and a triplet blocking layer in a red-yellow phosphorescence device or a green phosphorescence device and also serving as a hole injecting/transporting layer in a blue fluorescence device.

Moreover, non-Patent Literature 1 proposes a method of improving a luminous efficiency of an organic fluorescence device configured to excite a fluorescent device using a phosphorescent sensitizer.

CITATION LIST

Patent Literature

Patent Literature 1: JP10-153967A
Patent Literature 2: International Publication No. WO2012/157211

Non-Patent Literature(s)

Non-Patent Literature 1: M. A. Baldo, et al (2 persons), "High-Efficiency fluorescent organic light-emitting devices using a phosphorescent sensitizer", NATURE, Feb. 17, 2000, volume 403, pp. 750-753.
Non-Patent Literature 2: Takahiro Higuchi, et al (2 persons), "High-Efficiency White Organic Light-Emitting Diodes Based on a Blue Thermally Activated Delayed Fluorescent Emitter Combined with Green and Red Fluorescent Emitters", Advanced Materials, (DOI: 10.1002/adma.201404967)

SUMMARY OF THE INVENTION

Problems to be Solved by the Invention

An object of the invention is to provide an organic EL light-emitting apparatus capable of improving a luminous efficiency and to provide an electronic device including the organic EL light-emitting apparatus.

Means for Solving the Problems

According to an aspect of the invention, an organic EL light-emitting apparatus includes: a plurality of pixels including a first pixel and a second pixel, in which the first pixel and the second pixel each include a common layer in a shared manner, a pixel(s) other than the second pixel includes a non-common layer, the common layer includes a delayed fluorescent compound, the second pixel is configured to emit light from the common layer, and the pixel(s) other than the second pixel is configured to emit light from the non-common layer.

According to another aspect of the invention, an electronic device includes the organic EL light-emitting apparatus according to the above aspect.

According to the above aspects of the invention, an organic EL light-emitting apparatus capable of improving a luminous efficiency and an electronic device including the organic EL light-emitting apparatus can be provided.

DESCRIPTION OF EMBODIMENTS

First Exemplary Embodiment

Figure 1:
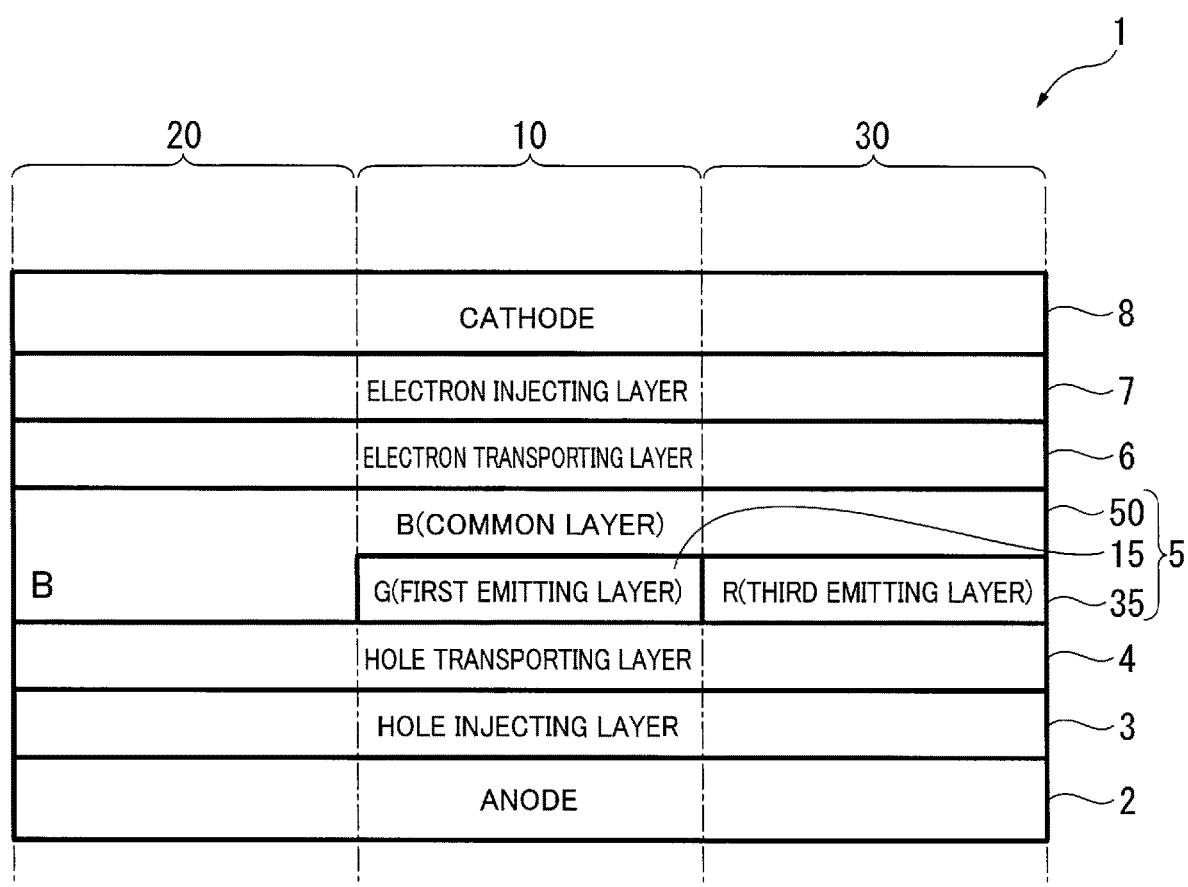
FIG. 1 schematically shows an organic EL light-emitting apparatus according to a first exemplary embodiment.

FIG. 1 schematically shows an organic EL light-emitting apparatus 1 according to a first exemplary embodiment.

The organic EL light-emitting apparatus 1 includes a first pixel 10, a second pixel 20 and a third pixel 30. In the first exemplary embodiment, the first pixel 10, the second pixel 20 and the third pixel 30 of the organic EL light-emitting apparatus 1 are provided in parallel. In the first exemplary embodiment, the organic EL light-emitting apparatus 1 in which the first pixel 10 emits a green light, the second pixel 20 emits a blue light, and the third pixel 30 emits a red light will be described as an example. A "pixel other than the second pixel" means a pixel different from the second pixel in structure. In the first exemplary embodiment, for instance, the first pixel and the third pixel correspond to the "pixel other than the second pixel." The "pixel other than the second pixel" is not limited to two kinds of pixels as described in the first exemplary embodiment, but may be provided in a single kind or in three or more kinds.

The organic EL light-emitting apparatus 1 includes an anode 2, a hole injecting layer 3, a hole transporting layer 4, an emitting zone 5, an electron transporting layer 6, an electron injecting layer 7, and a cathode 8. The anode 2, the hole injecting layer 3, the hole transporting layer 4, the emitting zone 5, the electron transporting layer 6, the electron injecting layer 7, and the cathode 8 are laminated in this order.

The emitting zone 5 emits light in the organic EL light-emitting apparatus 1. The structure of the emitting zone 5 differs in the first pixel 10, the second pixel 20, and the third pixel 30. The emitting zone 5 has a common layer 50 containing a compound exhibiting delayed fluorescence (occasionally, referred to as a delayed fluorescent compound). The common layer 50 of the first exemplary embodiment is a layer shared by the first pixel 10, the second pixel 20 and the third pixel 30. The common layer 50 transfers energy generated by excitation of the delayed fluorescent compound contained in the common layer 50 to respective non-common layers of the first pixel 10 and the third pixel 30 to sensitize compounds contained in the non-common layers. In the first exemplary embodiment, the common layer 50 may further contain a compound exhibiting fluorescence (occasionally, referred to as a first fluorescent compound).

The emitting zone 5 of the first pixel 10 includes: a first emitting layer 15 (non-common layer) provided between the hole transporting layer 4 and the electron transporting layer 6; and the common layer 50 provided between the first emitting layer 15 and the electron transporting layer 6. The first emitting layer 15 is in contact with the common layer 50. A compound contained in the first emitting layer 15 receives energy directly or via the first fluorescent compound from the delayed fluorescent compound contained in the common layer 50, thereby being sensitized. In the first exemplary embodiment, the first emitting layer 15 contains a second fluorescent compound. Since the common layer 50 in contact with the first emitting layer 15 contains the delayed fluorescent compound, the second fluorescent compound can efficiently emit light. In other words, a luminous efficiency of the first pixel 10 is improvable.

The emitting zone 5 of the second pixel 20 has the common layer 50. The second pixel 20 emits light from the common layer 50. Accordingly, the common layer 50 of the second pixel also serves as a second emitting layer in the organic EL light-emitting apparatus 1. When the common layer 50 of the second pixel 20 contains the delayed fluorescent compound and the first fluorescent compound, the first fluorescent compound can efficiently emit light. In other words, a luminous efficiency of the second pixel 20 is improvable. A singlet energy of the delayed fluorescent compound is preferably larger than a singlet energy of the first fluorescent compound.

The common layer 50 may further contain a third compound. A singlet energy of the third compound is preferably larger than the singlet energy of the delayed fluorescent compound. When the common layer 50 contains the first fluorescent compound, preferably, the singlet energy of the delayed fluorescent compound is larger than the singlet energy of the first fluorescent compound, and further, the singlet energy of the third compound is larger than the singlet energy of the delayed fluorescent compound.

The emitting zone 5 of the third pixel 30 includes: a third emitting layer 35 (non-common layer) provided between the hole transporting layer 4 and the electron transporting layer 6; and the common layer 50 provided between the third emitting layer 35 and the electron transporting layer 6. The third emitting layer 35 is in contact with the common layer 50. A compound contained in the third emitting layer 35 receives energy directly or via the first fluorescent compound from the delayed fluorescent compound contained in the common layer 50, thereby being sensitized. In the first exemplary embodiment, the third emitting layer 35 contains a third fluorescent compound. Since the common layer 50 in contact with the third emitting layer 35 contains the delayed fluorescent compound, the third fluorescent compound can efficiently emit light. In other words, a luminous efficiency of the third pixel 30 is improvable.

In the organic EL light-emitting apparatus 1, preferably, the second pixel 20 emits light from the common layer 50, the first pixel 10 emits light not from the common layer 50 but from the first emitting layer 15, and the third pixel 30 also emits light not from the common layer 50 but from the third emitting layer 35. Moreover, the first pixel 10 may emit light in mixed colors of the light from the common layer 50 and the light from the first emitting layer 15. The third pixel 30 may emit light in mixed colors of the light from the common layer 50 and the light from the third emitting layer 35.

A peak wavelength of the emission from the common layer 50 is preferably smaller than a peak wavelength of the emission from the first emitting layer 15 and the third emitting layer 35 (non-common layers). When such a relationship of the peak wavelength is satisfied, the energy transfer from the common layer 50 to the first emitting layer 15 and the energy transfer from the common layer 50 to the third emitting layer 35 efficiently occur.

An energy at an emission level of the delayed fluorescent compound contained in the common layer 50 is preferably larger than an energy at an emission level of the compound contained in the first emitting layer 15 (non-common layer) and an energy an emission level of the compound contained in the third emitting layer 35 (non-common layer). When such a relationship in the energy at the emission levels is satisfied, the energy transfer from the common layer 50 to the first emitting layer 15 and the energy transfer from the common layer 50 to the third emitting layer 35 are efficiently generated.

Delayed Fluorescence

Delayed fluorescence (thermally activated delayed fluorescence) is explained in "ADACHI, Chihaya, ed., Yuki Hando-tai no Debaisu Bussei (Device Physics of Organic Semiconductors), Kodansha, pp. 261-268." According to this literature, when an energy gap $\Delta E_{13}$ between the singlet state and the triplet state of a fluorescent material can be reduced, inverse energy transfer from the triplet state to the singlet state, which usually occurs at a low transition probability, occurs at a high transition probability to cause thermally activated delayed fluorescence (TADF). Further, FIG. 10.38 in this literature illustrates an occurrence mechanism of the delayed fluorescence. The delayed fluorescent compound of the first exemplary embodiment is a compound exhibiting thermally activated delayed fluorescence caused by this mechanism. Occurrence of delayed fluorescence emission can be determined by transient PL (Photo Luminescence) measurement.

The behavior of delayed fluorescence can be analyzed based on the decay curve obtained by the transient PL measurement. The transient PL measurement is a process where a sample is irradiated with a pulse laser to be excited, and a decay behavior (transient characteristics) of PL emission after the irradiation is stopped is measured. PL emission using a TADF material is divided into an emission component from singlet excitons generated by the first PL excitation and an emission component from singlet excitons generated via triplet excitons. The lifetime of the singlet excitons generated by the first PL excitation is in a nanosecond order and considerably short. Emission from these singlet excitons thus decays immediately after the irradiation with the pulse laser.

In contrast, delayed fluorescence, which is emission from the singlet excitons generated via long-life triplet excitons, decays slowly. There is thus a large difference in time between emission from the singlet excitons generated by the first PL excitation and emission from the singlet excitons generated via triplet excitons. Therefore, a luminous intensity resulting from the delayed fluorescence can be obtained.

Figure 2:
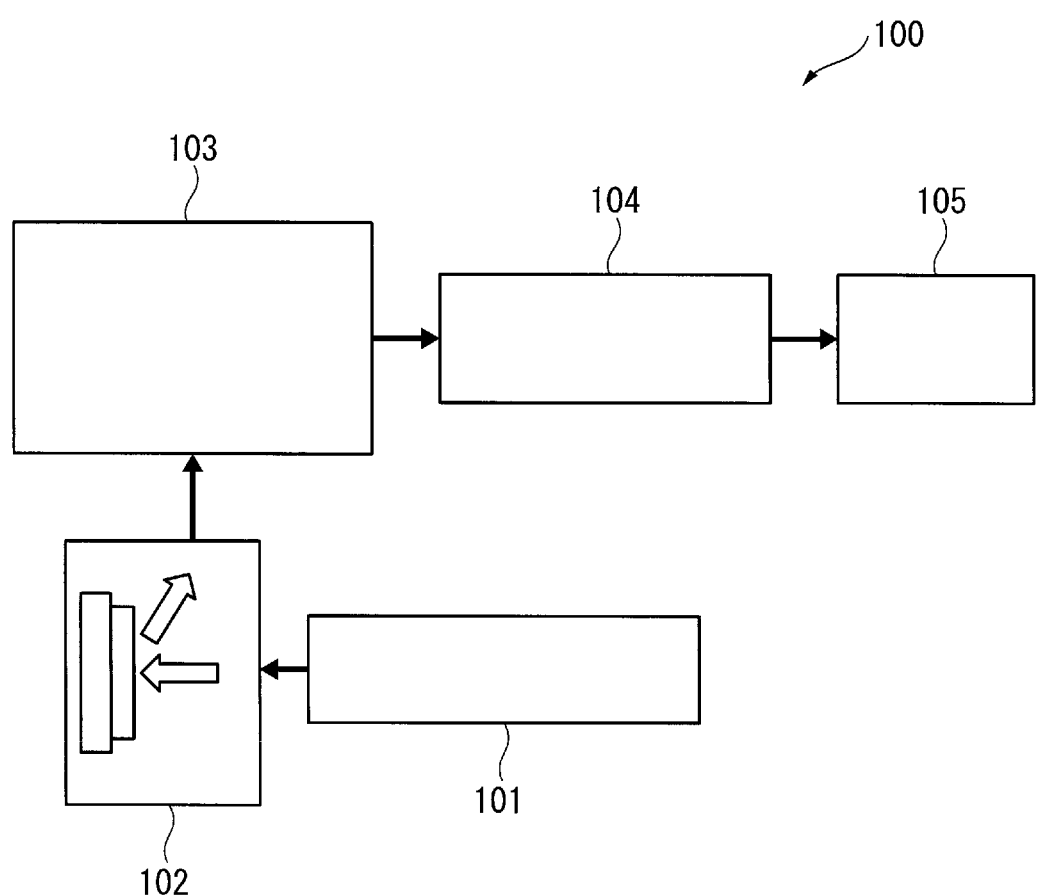
FIG. 2 schematically shows a device for measuring transient PL.

FIG. 2 schematically shows an exemplary device for measuring transient PL.

A transient PL measuring device 100 of the first exemplary embodiment includes: a pulse laser 101 capable of emitting light with a predetermined wavelength; a sample chamber 102 configured to house a measurement sample; a spectrometer 103 configured to disperse light emitted from the measurement sample; a streak camera 104 configured to form a two-dimensional image; and a personal computer 105 configured to analyze the two-dimensional image imported thereinto. It should be noted that transient PL may be measured by a device different from one described in the first exemplary embodiment.

The sample to be housed in the sample chamber 102 is prepared by forming a thin film, which is made of a matrix material doped with a doping material at a concentration of 12 mass %, on a quartz substrate.

The thus-obtained thin film sample is housed in the sample chamber 102, and is irradiated with a pulse laser emitted from the pulse laser 101 to excite the doping material. The emitted excitation light is taken in a 90-degree direction with respect to the irradiation direction of the excitation light, and is dispersed by the spectrometer 103. A two-dimensional image of the light is formed through the streak camera 104. In the thus-obtained two-dimensional image, an ordinate axis corresponds to time, an abscissa axis corresponds to wavelength, and a bright spot corresponds to luminous intensity. The two-dimensional image is taken at a predetermined time axis, thereby obtaining an emission spectrum with an ordinate axis representing luminous intensity and an abscissa axis representing wavelength. Further, the two-dimensional image is taken at a wavelength axis, thereby obtaining a decay curve (transient PL) with an ordinate axis representing the logarithm of luminous intensity and an abscissa axis representing time.

For instance, a thin film sample A was prepared using a reference compound M1 below as a matrix material and a reference compound DP1 below as a doping material, and transient PL was measured.

[Formula 1]

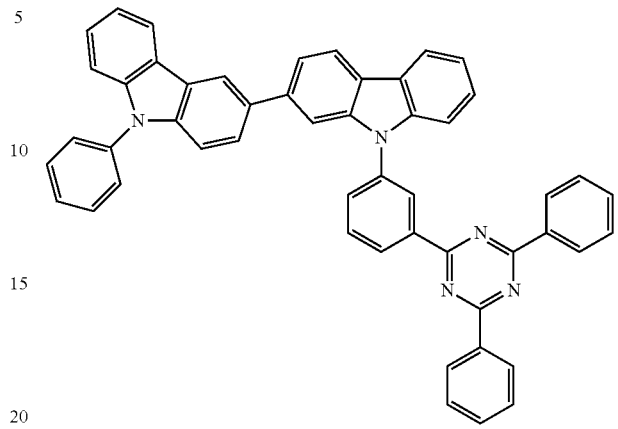

Reference Compound M1

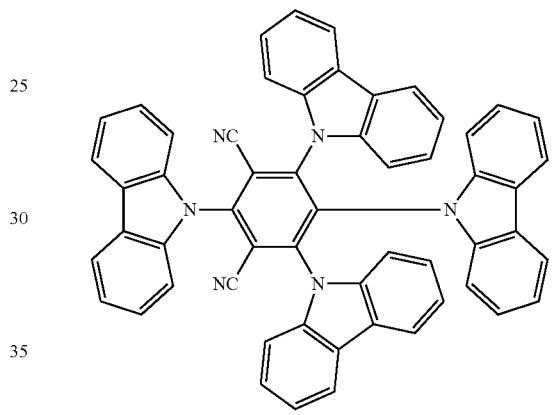

Reference Compound DP1

Respective decay curves of the thin film sample A and a thin film sample B were analyzed. The thin film sample B was prepared in the same manner as described above using a reference compound M2 below as a matrix material and the reference compound DP1 as a doping material.

Figure 3:
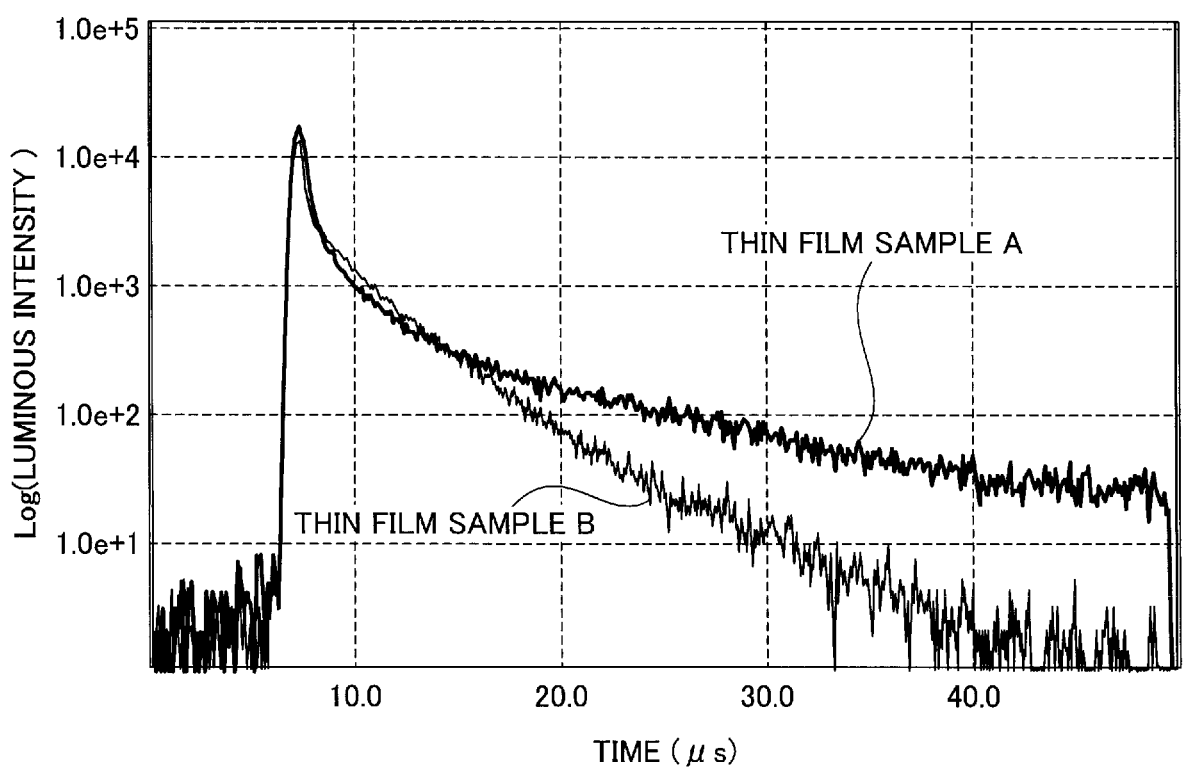
FIG. 3 shows examples of a transient PL decay curve.

FIG. 3 shows a decay curve obtained from transient PL measured using each of the thin film samples A and B.

[Formula 2]

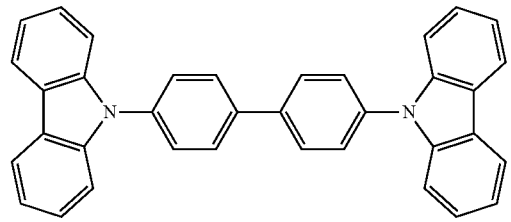

Reference Compound M2

As described above, an emission decay curve with an ordinate axis representing luminous intensity and an abscissa axis representing time can be obtained by the transient PL measurement. Based on the emission decay curve, a fluorescence intensity ratio between fluorescence emitted from a singlet state generated by photo-excitation and delayed fluorescence emitted from a singlet state generated by inverse energy transfer via a triplet state can be estimated. In a delayed fluorescent material, a ratio of the intensity of the slowly decaying delayed fluorescence to the intensity of the promptly decaying fluorescence is relatively large.

In the first exemplary embodiment, the luminescence amount of the delayed fluorescence can be obtained using the device shown in FIG. 2. Emission from the delayed fluorescent compound include: Prompt emission observed immediately when the excited state is achieved by exciting the delayed fluorescent compound with a pulse beam (i.e., a beam emitted from a pulse laser) having an absorbable wavelength; and Delay emission observed not immediately when but after the excited state is achieved. In the first exemplary embodiment, the amount of Delay emission is preferably 5% or more relative to the amount of Prompt emission.

The amount of Prompt emission and the amount of Delay emission can be obtained in the same method as a method described in "Nature 492, 234-238, 2012." The amount of Prompt emission and the amount of Delay emission may be calculated using a device different from one described in the above Literature.

For instance, a sample usable for measuring the delayed fluorescence may be prepared by co-depositing the delayed fluorescent compound and a compound TH-2 below on a quartz substrate at a ratio of the delayed fluorescent compound being 12 mass % to form a 100-nm-thick thin film.

[Formula 3]

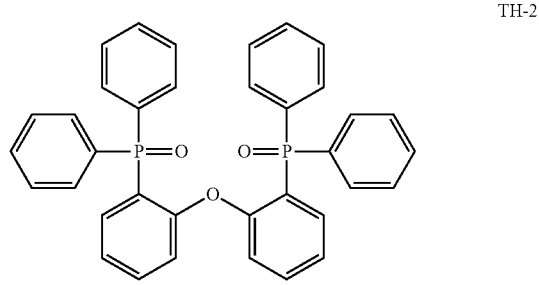

TH-2

TADF Mechanism

A compound having a small $\Delta ST(DF)$ is preferably used as the delayed fluorescent compound, whereby inverse intersystem crossing from the triplet energy level of the delayed fluorescent compound to the singlet energy level thereof is easily caused by heat energy given from the outside. An energy state conversion mechanism to perform spin exchange from the triplet state of electrically excited excitons within the organic EL device to the singlet state by inverse intersystem crossing is referred to as a TADF mechanism. A difference between the lowest singlet state S1 and the lowest triplet state T1 is defined as $\Delta ST$.

In the first exemplary embodiment, the common layer 50 in the emitting zone 5 of the second pixel 20 contains the delayed fluorescent compound. Moreover, the common layer 50 in the emitting zone 5 of the second pixel 20 may further contain the first fluorescent compound. When the compound having a small $\Delta ST(DF)$ is used as the delayed fluorescent compound, inverse intersystem crossing from the lowest triplet state $T1(DF)$ to the lowest singlet state $S1(DF)$ can be caused by a heat energy. Accordingly, Förster energy transfer from the lowest singlet state $S1(DF)$ of the delayed fluorescent compound to the lowest singlet state $S1(M1)$ of the first fluorescent compound is caused. As a result, fluorescence from the lowest singlet state $S1(M1)$ of the first fluorescent compound can be observed.

In the first exemplary embodiment, the common layer 50 in the emitting zone 5 of the first pixel 10 is in contact with the first emitting layer 15. The first emitting layer 15 contains the second fluorescent compound. Accordingly, Förster energy transfer from the lowest singlet state $S1(DF)$ of the delayed fluorescent compound to the lowest singlet state $S1(M2)$ of the second fluorescent compound is caused. Alternatively, when the common layer 50 contains the first fluorescent compound, Förster energy transfer from the lowest singlet state $S1(M1)$ of the first fluorescent compound to the lowest singlet state $S1(M2)$ of the second fluorescent compound is caused. As a result, fluorescence from the lowest singlet state $S1(M2)$ of the second fluorescent compound can be observed. The singlet energy $S(DF)$ of the delayed fluorescent compound is preferably larger than a singlet energy $S(M2)$ of the second fluorescent compound.

In the first exemplary embodiment, the common layer 50 in the emitting zone 5 of the third pixel 30 is in contact with the third emitting layer 35. The third emitting layer 35 contains the third fluorescent compound. Accordingly, Förster energy transfer from the lowest singlet state $S1(DF)$ of the delayed fluorescent compound to a lowest singlet state $S1(M3)$ of the third fluorescent compound is caused. Alternatively, when the common layer 50 contains the first fluorescent compound, Förster energy transfer from the lowest singlet state $S1(M1)$ of the first fluorescent compound to the lowest singlet state $S1(M3)$ of the third fluorescent compound is caused. As a result, fluorescence from the lowest singlet state $S1(M3)$ of the third fluorescent compound can be observed. The singlet energy $S(DF)$ of the delayed fluorescent compound is preferably larger than the singlet energy $S(M3)$ of the third fluorescent compound.

The luminous efficiency is improvable by using the delayed fluorescent compound in the common layer 50 as in the organic EL light-emitting apparatus 1 of the first exemplary embodiment. Further, also in the organic EL light-emitting apparatus 1 having a plurality of pixels exhibiting different colors, since it is only necessary to provide the common layer 50 to be shared by the pixels, the arrangement and manufacturing steps of the organic EL light-emitting apparatus 1 can be simplified.

An organic EL light-emitting apparatus with the common layer containing a fluorescent compound and an organic EL light-emitting apparatus with the common layer containing a phosphorescent compound have been typically proposed. These EL light-emitting apparatuses aim for improving the luminous efficiency by causing energy transfer from the common layer to an adjacent emitting layer to sensitize the compound contained in the adjacent emitting layer.

For instance, use of the phosphorescent compound in the common layer can improve the internal quantum efficiency to 100%. However, since phosphorescence is forbidden spin transition, Förster radius (a distance of energy transfer) is small and energy transfer from the common layer to the emitting layer is not easily caused.

When the fluorescent compound is used in the common layer, since fluorescence is allowable transition, Förster radius is large and energy transfer from the common layer to the emitting layer is easily caused. However, since the EL internal quantum efficiency is 25%, the luminous efficiency is problematic.

It is expected that the delayed fluorescent compound contained in the common layer 50 in the organic EL light-emitting apparatus 1 of the first exemplary embodiment enables to enhance the internal quantum efficiency to 100%. Further, since delayed fluorescence is allowable transition, Förster radius is large and energy transfer from the common layer to the emitting layer is easily caused. Accordingly, the organic EL light-emitting apparatus 1 of the first exemplary embodiment can improve the luminous efficiency.

When the common layer 50 contains the first fluorescent compound in the organic EL light-emitting apparatus 1 of the first exemplary embodiment, energy transfer is caused from the delayed fluorescent compound to the first fluorescent compound in the common layer 50. Further, since a radiation speed constant of the first fluorescent compound is larger than a radiation speed constant of the delayed fluorescent compound, the Förster radius is large and energy transfer from the common layer 50 to the second fluorescent compound and the third fluorescent compound is easily caused. Accordingly, the organic EL light-emitting apparatus 1 is more preferable in order to improve the luminous efficiency.

In the organic EL light-emitting apparatus 1 of the first exemplary embodiment, each of the first emitting layer 15 and the third emitting layer 35 contains the fluorescent compound. Since an absorbance coefficient of the fluorescent compound is higher than those of the delayed fluorescent compound and the phosphorescent compound, the fluorescent compound is likely to receive energy from the delayed fluorescent compound of the common layer 50. Accordingly, the organic EL light-emitting apparatus 1 is more preferable in order to improve the luminous efficiency.

In the first exemplary embodiment, an energy gap $T_{77K}$ (DF) at 77 [K] of the delayed fluorescent compound is preferably larger than an energy gap $T_{77K}$(M1) at 77 [K] of the first fluorescent compound. $T_{77K}$(DF) is preferably 2.0 eV or more, more preferably 2.2 eV or more.

Relationship Between Triplet Energy and Energy Gap at 77 [K]

Description will be made on a relationship between a triplet energy and an energy gap at 77 [K]. In the first exemplary embodiment, the energy gap at 77 [K] is different from a typical triplet energy in some aspects.

The triplet energy is measured as follows. Firstly, a target compound for measurement is deposited on a quartz substrate to prepare a sample. Alternatively, the target compound is dissolved in an appropriate solvent to prepare a solution and the solution is encapsulated in a quartz glass pipe to prepare a sample. A phosphorescent spectrum (ordinate axis: phosphorescent luminous intensity, abscissa axis: wavelength) of the sample is measured at a low temperature (77K). A tangent is drawn to the rise of the phosphorescent spectrum on the short-wavelength side. The triplet energy is calculated by a predetermined conversion equation based on a wavelength value at an intersection of the tangent and the abscissa axis.

The delayed fluorescent compound usable in the first exemplary embodiment is preferably a compound having a small ΔST. When ΔST is small, intersystem crossing and inverse intersystem crossing are likely to occur even at a low temperature (77K), so that the singlet state and the triplet state coexist. As a result, the spectrum to be measured in the same manner as the above includes emission from both the singlet state and the triplet state. Although it is difficult to distinguish the emission from the singlet state from the emission from the triplet state, the value of the triplet energy is basically considered dominant.

Accordingly, in the first exemplary embodiment, the triplet energy is measured by the same method as a typical triplet energy T, but a value measured in the following manner is referred to as an energy gap $T_{77K}$ in order to differentiate the measured energy from the typical triplet energy in a strict meaning. In the measurement using a thin film, the target compound for the measurement is deposited at a film thickness of 100 nm on a quartz substrate to form a sample. A phosphorescent spectrum (ordinate axis: phosphorescent luminous intensity, abscissa axis: wavelength) of the sample is measured at a low temperature (77K). A tangent is drawn to the rise of the phosphorescent spectrum on the short-wavelength side. An energy amount is calculated by the following conversion equation (F1) based on a wavelength value $\lambda_{edge}$ [nm] at an intersection of the tangent and the abscissa axis and is defined as an energy gap $T_{77K}$.

$$T_{77K}[eV]=1239.85/\lambda_{edge} \quad \text{Conversion Equation (F1):}$$

The tangent to the rise of the phosphorescence spectrum on the short-wavelength side is drawn as follows. While moving on a curve of the phosphorescence spectrum from the short-wavelength side to the maximum spectral value closest to the short-wavelength side among the maximum spectral values, a tangent was checked at each point on the curve toward the long-wavelength of the phosphorescence spectrum. An inclination of the tangent was increased as the curve rises (i.e., a value of the ordinate axis was increased). A tangent drawn at a point of the maximum inclination (i.e., a tangent at an inflection point) was defined as the tangent to the rise of the phosphorescence spectrum on the short-wavelength side.

The maximum with peak intensity being 15% or less of the maximum peak intensity of the spectrum was not included in the above-mentioned maximum closest to the short-wavelength side of the spectrum. The tangent drawn at a point of the maximum spectral value being closest to the short-wavelength side and having the maximum inclination was defined as a tangent to the rise of the phosphorescence spectrum on the short-wavelength side.

For phosphorescence measurement, a spectrophotofluorometer body F-4500 (manufactured by Hitachi High-Technologies Corporation) is usable. The measurement instrument is not limited to this arrangement. A combination of a cooling unit, a low temperature container, an excitation light source and a light-receiving unit may be used for measurement.

Singlet Energy S

The singlet energy S is measured as follows.

A target compound to be measured is deposited to form a 100-nm thick film on a quartz substrate to prepare a sample. An emission spectrum of the sample is measured at a normal temperature (300K), the spectrum being expressed in coordinates of which the ordinate axis indicates luminous intensity and of which the abscissa axis indicates the wavelength. A tangent is drawn to the rise of the emission spectrum on the short-wavelength side, and a wavelength value $\lambda_{edge}$ [nm] at an intersection of the tangent and the abscissa axis is obtained. The singlet energy S is calculated from the following conversion equation (F2) based on the wavelength value.

$$S[eV]=1239.85/\lambda_{edge} \quad \text{Conversion Equation (F2):}$$

Absorption spectrum is measured using a spectrophotometer. For instance, a spectrophotometer (device name: U3310 manufactured by Hitachi, Ltd.) is usable.

The tangent to the rise of the emission spectrum on the short-wavelength side was drawn as follows. While moving on a curve of the emission spectrum from the short-wavelength side to the maximum spectral value closest to the short-wavelength side among the maximum spectral values, a tangent is checked at each point on the curve toward the long-wavelength of the emission spectrum. An inclination of the tangent was increased as the curve rises (i.e., a value of the ordinate axis was increased). A tangent drawn at a point of the maximum inclination (i.e., a tangent at an inflection point) was defined as the tangent to the rise of the emission spectrum on the short-wavelength side.

The maximum with peak intensity being 15% or less of the maximum peak intensity of the spectrum is not included in the above-mentioned maximum closest to the short-wavelength side of the spectrum. The tangent drawn at a point of the maximum spectral value being closest to the short-wavelength side and having the maximum inclination is defined as a tangent to the rise of the emission spectrum on the short-wavelength side.

It should be noted that, when the measurement results using the sample deposited on the quartz is significantly different from the measurement results using the solution, such a difference is assumed to be caused by formation of molecular aggregate, a strong correlation with a solvent, and the like. For this reason, the above measurement may be conducted using a sample obtained by co-depositing on a quartz substrate the measurement target compound and another appropriate material having a large energy gap and forming no exciplex.

Substrate

The organic EL light-emitting apparatus 1 may further include a substrate as a support. For instance, glass, quartz, plastics and the like are usable as the substrate. A flexible substrate is also usable. The flexible substrate is a bendable substrate. Examples of the flexible substrate include plastic substrates made of polycarbonate and polyvinyl chloride.

Anode

Metal, alloy, an electrically conductive compound, a mixture thereof and the like which have a large work function (specifically, of 4.0 eV or more) are preferably usable as a material for the anode 2. Specific examples of the material for the anode 2 include indium tin oxide (ITO), indium tin oxide containing silicon or silicon oxide, indium zinc oxide, tungsten oxide, indium oxide containing zinc oxide and graphene. In addition, the examples of the material for the anode 2 further include gold (Au), platinum(Pt), or nitrides of metal materials (e.g., titanium nitride).

Hole Injecting Layer

The hole injecting layer 3 is a layer containing a highly hole-injectable substance. Examples of the highly hole-injectable substance include molybdenum oxide, titanium oxide, vanadium oxide, rhenium oxide, ruthenium oxide, chromium oxide, zirconium oxide, hafnium oxide, tantalum oxide, silver oxide, tungsten oxide, manganese oxide, aromatic amine compound, and high-molecular weight compound (e.g., oligomer, dendrimer, polymer).

Hole Transporting Layer

The hole transporting layer 4 is a layer containing a highly hole-transportable substance. Examples of the compound usable for the hole transporting layer 4 include an aromatic amine compound, carbazole derivative, and anthracene derivative. A high-molecular weight compound such as poly(N-vinylcarbazole) (abbreviation: PVK) and poly(4-vinyltriphenylamine) (abbreviation: PVTPA) is also usable for the hole transporting layer 4. However, in addition to the above substances, any substance having a hole transporting performance higher than an electron transporting performance may be used for the hole transporting layer 4. A highly hole-transportable substance may be provided in the form of a single layer or a laminated layer of two or more layers of the above sub stance(s).

Fluorescent Compound

The fluorescent compound contained in the common layer 50, the first emitting layer 15 and the third emitting layer 35 is a compound capable of emitting light in the singlet state. The kind of the fluorescent compound is not particularly limited. Examples of the blue emitting fluorescent compound include a pyrene derivative, styrylamine derivative, chrysene derivative, fluoranthene derivative, fluorene derivative, diamine derivative, and triarylamine derivative. Examples of the green emitting fluorescent compound include a coumarin derivative, pyrromethene-boron complex, and aromatic amine derivative. Examples of the red emitting fluorescent compound include a tetracene derivative, periflanthene derivative, pyrromethene-boron complex, and diamine derivative.

The first emitting layer 15 and the third emitting layer 35 may contain the above fluorescent compound in a manner to be dispersed in another substance (host material). Various compounds are usable as a substance for dispersing a highly emittable substance. The host material is preferably a substance having a Lowest Unoccupied Molecular Orbital (LUMO) level higher than that of the highly emittable substance and having a Highest Occupied Molecular Orbital (HOMO) level lower than that of the highly emittable sub stance.

Examples of the substance (host material) for dispersing the highly emittable substance include a metal complex, heterocyclic compound, fused aromatic compound, and aromatic amine compound. Examples of the metal complex include an aluminum complex, beryllium complex and zinc complex. Examples of the heterocyclic compound include an oxadiazole derivative, benzimidazole derivative, dibenzofuran derivative, dibenzothiophene derivative, azine derivative, indole derivative, carbazole derivative, and phenanthroline derivative. Examples of the fused aromatic compound include an anthracene derivative, phenanthrene derivative, triphenylene derivative, pyrene derivative, and chrysene derivative. Examples of the aromatic amine compound include triarylamine derivative and fused polycyclic aromatic amine derivative.

Electron Transporting Layer

The electron transporting layer 6 is a layer containing a highly electron-transportable substance. Examples of the compound usable for the electron transporting layer 6 include a metal complex, heterocyclic aromatic compound and high-molecular weight compound. Examples of the metal complex include an aluminum complex, beryllium complex and zinc complex. Examples of the heterocyclic aromatic compound include an imidazole derivative, benzimidazole derivative, azine derivative, carbazole derivative, and phenanthroline derivative.

Electron Injecting Layer

The electron injecting layer 7 is a layer containing a highly electron-injectable substance. Examples of the compound usable for the electron injecting layer 7 include an alkali metal, alkaline earth metal, alkali metal compound and alkaline earth metal compound. Examples of the compound usable for the electron injecting layer 7 include lithium (Li), lithium fluoride (LiF), cesium fluoride (CsF), calcium fluoride ($CaF_2$), and lithium oxide (LiOx). Examples of the metal complex include a lithium quinolinolate (LiQ) complex.

Cathode

Metal, alloy, an electrically conductive compound, a mixture thereof and the like, which have a small work function, specifically, of 3.8 eV or less, is preferably usable as a material for the cathode 8. Specific examples of the material usable for the cathode 8 include: the elements belonging to Groups 1 and 2 of the periodic table of the elements, namely, an alkali metal such as lithium (Li) and cesium (Cs) and an alkaline earth metal such as magnesium (Mg); alloy thereof (e.g., MgAg, AlLi); a rare earth metal such as europium (Eu) and ytterbium (Yb); and alloy thereof.

Film Thickness

There is no restriction except for the above particular description for a film thickness of each of the layers of the organic EL light-emitting apparatus 1. The film thickness is typically preferably in a range of several nanometers to 1 μm because an excessively-thinned film is likely to cause defects such as a pin hole while an excessively-thickened film requires high voltage to be applied and deteriorates efficiency.

Layer Formation Method(s)

There is no restriction except for the above particular description for a method for forming each layer of the organic EL light-emitting apparatus 1. Known methods such as dry film-forming and wet film-forming are applicable. Examples of the dry film-forming include vacuum deposition, sputtering, plasma and ion plating. Examples of the wet film-forming include spin coating, dipping, flow coating and ink-jet printing.

Electronic Device

The organic EL light-emitting apparatus 1 is usable for an electronic device such as a display unit and a light-emitting unit. Examples of the display unit include display components such as an organic EL panel module, TV, mobile phone, tablet, and personal computer. Examples of the light-emitting unit include an illuminator and a vehicle light.

Second Exemplary Embodiment

Arrangement(s) of an organic EL light-emitting apparatus according to a second exemplary embodiment will be described below. In the description of the second exemplary embodiment, the same components as those in the first exemplary embodiment are denoted by the same reference signs and names to simplify or omit an explanation of the components. In the second exemplary embodiment, the same materials and compounds as described in the first exemplary embodiment are usable for a material and a compound which are not particularly described.

Figure 4:
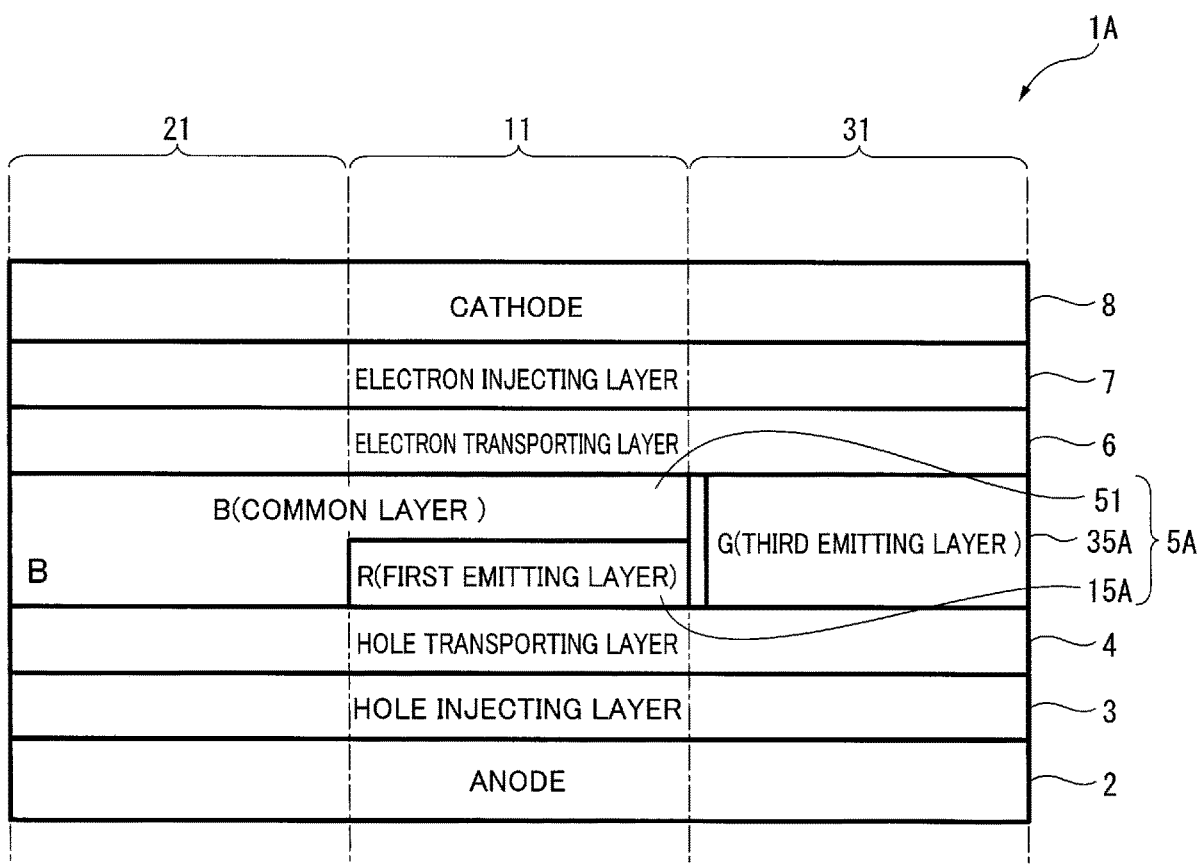
FIG. 4 schematically shows an organic EL light-emitting apparatus according to a second exemplary embodiment.

FIG. 4 schematically shows an organic EL light-emitting apparatus 1A according to the second exemplary embodiment. The organic EL light-emitting apparatus 1A of the second exemplary embodiment is different from the organic EL light-emitting apparatus 1 of the first exemplary embodiment in that a common layer 51 is a layer shared by a first pixel 11 and a second pixel 21 and that a third pixel 31 is in no contact with the common layer 51. Other components are the same as those in the first exemplary embodiment.

In the second exemplary embodiment, the organic EL light-emitting apparatus 1A in which the first pixel 11 emits a red light, the second pixel 21 emits a blue light, and the third pixel 31 emits a green light will be described as an example.

An emitting zone 5A of the organic EL light-emitting apparatus 1A includes the common layer 51 containing the delayed fluorescent compound. In the second exemplary embodiment, the common layer 51 may further contain the first fluorescent compound.

The emitting zone 5A of the first pixel 11 includes: a first emitting layer 15A (non-common layer) provided between the hole transporting layer 4 and the electron transporting layer 6; and the common layer 51 provided between the first emitting layer 15A and the electron transporting layer 6. The first emitting layer 15A is in contact with the common layer 51. In the second exemplary embodiment, since the first emitting layer 15A contains the second fluorescent compound, a luminous efficiency of the first pixel 11 is improvable as described above.

The emitting zone 5A of the second pixel 21 has the common layer 51. The second pixel 21 emits light from the common layer 51. In the second pixel 21, the common layer 51 contains the delayed fluorescent compound. When the common layer 51 contains the first fluorescent compound, the luminous efficiency of the second pixel 21 is improvable as described above. The singlet energy of the delayed fluorescent compound is preferably larger than the singlet energy of the first fluorescent compound.

The emitting zone 5A of the third pixel 31 includes a third emitting layer 35A (non-common layer) between the hole transporting layer 4 and the electron transporting layer 6.

A peak wavelength of the emission from the common layer 51 is preferably smaller than a peak wavelength of the emission from the first emitting layer 15A (non-common layer). When such a relationship of the peak wavelength is satisfied, energy transfer is easily caused from the common layer 51 to the first emitting layer 15A

An energy at an emission level of the delayed fluorescent compound contained in the common layer 51 is preferably larger than an energy at an emission level of the compound contained in the first emitting layer 15A (non-common layer). When such a relationship of the energy at the emission level is satisfied, energy transfer is easily caused from the common layer 51 to the first emitting layer 15A.

Accordingly, the organic EL light-emitting apparatus 1A of the second exemplary embodiment can also improve the luminous efficiency.

Third Exemplary Embodiment

Arrangement(s) of an organic EL light-emitting apparatus according to a third exemplary embodiment will be described below. In the description of the third exemplary embodiment, the same components as those in the first and second exemplary embodiments are denoted by the same reference signs and names to simplify or omit an explanation of the components. In the third exemplary embodiment, the same materials and compounds as described in the first exemplary embodiment are usable for a material and a compound which are not particularly described.

Figure 5:
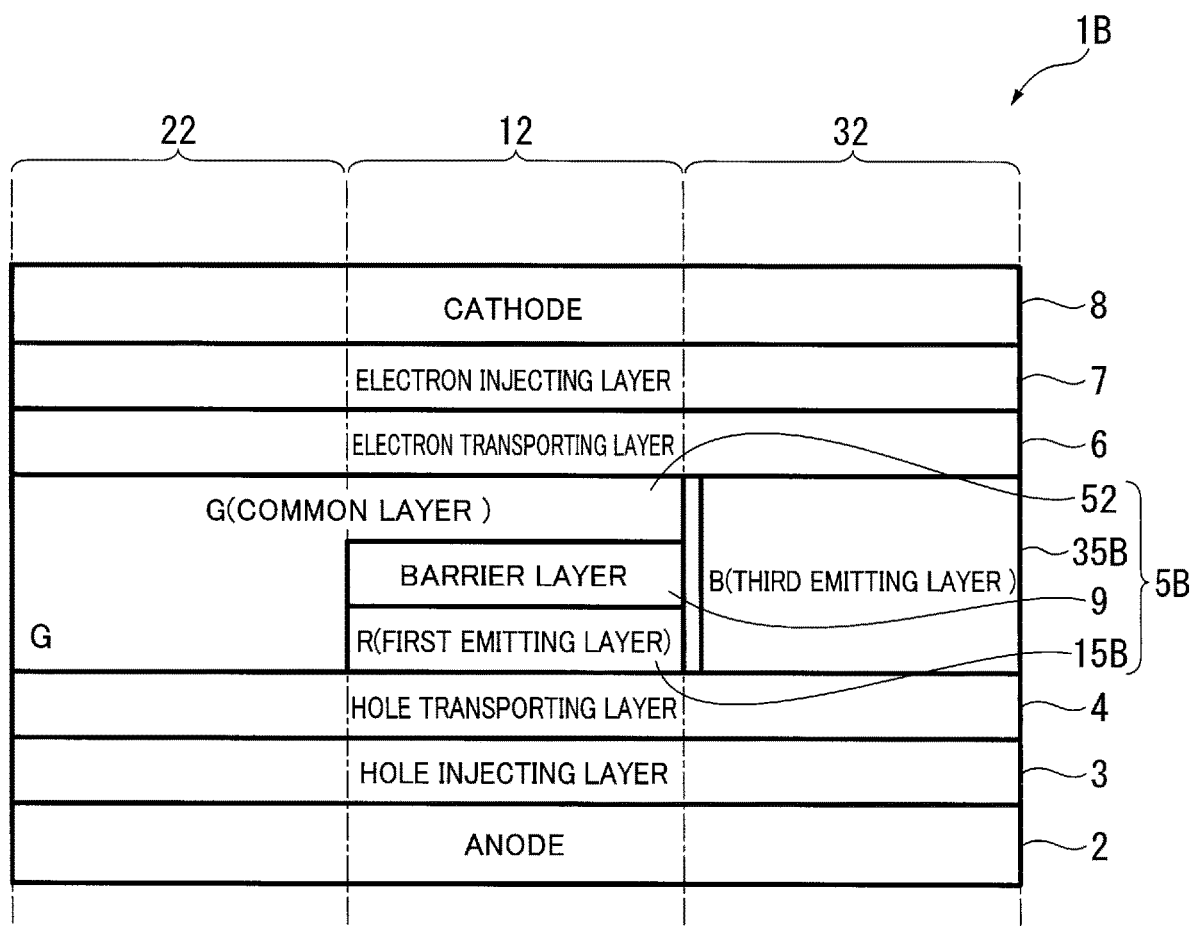
FIG. 5 schematically shows an organic EL light-emitting apparatus according to a third exemplary embodiment.

FIG. 5 schematically shows an organic EL light-emitting apparatus 1B according to the third exemplary embodiment. The organic EL light-emitting apparatus 1B of the third exemplary embodiment is different from the organic EL light-emitting apparatus 1 of the first exemplary embodiment in that a common layer 52 is a layer shared by a first pixel 12 and a second pixel 22, that a third pixel 32 is in no contact with the common layer 52, that a barrier layer 9 is provided between the common layer 52 and a first emitting layer 15B, and that the first pixel 12 emits a red light, the second pixel 22 emits a green light, and the third pixel 32 emits a blue light. Other components are the same as those in the first exemplary embodiment.

An emitting zone 5B of the organic EL light-emitting apparatus 1B includes the common layer 52 containing the delayed fluorescent compound. In the third exemplary embodiment, the common layer 52 may further contain the first fluorescent compound. The singlet energy of the delayed fluorescent compound is preferably larger than the singlet energy of the first fluorescent compound.

The emitting zone 5B of the first pixel 12 includes: the first emitting layer 15B (non-common layer) provided between the hole transporting layer 4 and the electron transporting layer 6; and the common layer 52 provided between the first emitting layer 15B and the electron transporting layer 6. In the third exemplary embodiment, the first emitting layer 15B contains the second fluorescent compound.

In the third exemplary embodiment, the barrier layer 9 is further provided between the common layer 52 and the first emitting layer 15B. An energy gap $T_{77K}(BL)$ at 77 [K] of the compound contained in the barrier layer 9 is preferably equal to or larger than the energy gap $T_{77K}(DF)$ at 77 [K] of the delayed fluorescent compound contained in the common layer 52. More preferably, the energy gap $T_{77K}(BL)$ of the compound contained in the barrier layer 9 is larger than the energy gap $T_{77K}(DF)$ of the delayed fluorescent compound contained in the common layer 52. Since the barrier layer 9 is provided between the common layer 52 and the first emitting layer 15B, a triplet energy can be inhibited from being transferred from the common layer 52 to the first emitting layer 15B, so that triplet excitons can be converted to singlet excitons within the common layer 52, and subsequently a singlet energy can be transferred to the first emitting layer 15B. Accordingly, the organic EL light-emitting apparatus 1B can improve the luminous efficiency of the first pixel 12.

Further, the energy gap $T_{77K}(BL)$ at 77[K] of the compound contained in the barrier layer 9 is preferably equal to or larger than an energy gap $T_{77K}(M2)$ at 77[K] of the second fluorescent compound contained in the first emitting layer 15B (non-common layer). A singlet energy of the compound contained in the barrier layer 9 is preferably equal to or larger than the singlet energy of the second fluorescent compound, more preferably, larger than the singlet energy of the second fluorescent compound.

The emitting zone 5B of the second pixel 22 has the common layer 52. The common layer 52 emits light in the second pixel 22. In the second pixel 22, the common layer 52 contains the delayed fluorescent compound. When the common layer 52 contains the first fluorescent compound, the luminous efficiency of the second pixel 22 is improvable as described above.

The emitting zone 5B of the third pixel 32 includes a third emitting layer 35B (non-common layer) between the hole transporting layer 4 and the electron transporting layer 6.

A peak wavelength of the emission from the common layer 52 is preferably smaller than a peak wavelength of the emission from the first emitting layer 15B (non-common layer). When such a relationship of the peak wavelength is satisfied, energy transfer is easily caused from the common layer 52 to the first emitting layer 15B.

An energy at an emission level of the delayed fluorescent compound contained in the common layer 52 is preferably larger than an energy at an emission level of the compound contained in the first emitting layer 15B (non-common layer). When such a relationship of the energy at the emission level is satisfied, energy transfer is easily caused from the common layer 52 to the first emitting layer 15B.

Accordingly, the organic EL light-emitting apparatus 1B of the third exemplary embodiment can also improve the luminous efficiency.

Modification of Embodiments

It should be noted that the invention is not limited to the above exemplary embodiments. The invention may include any modification and improvement compatible with the invention.

For instance, although the above exemplary embodiments are described with reference to examples in which the pixels respectively emit a red light, a green light and a blue light, the invention is not limited to the exemplary embodiments. Examples of the emission colors exhibited by the pixels include yellow, orange, light blue, violet and white.

Another example of the organic EL light-emitting apparatus may be configured such that the first pixel emits a green light and the third pixel emits a red light in the organic EL light-emitting apparatus 1A in the second exemplary embodiment.

Still another example of the organic EL light-emitting apparatus may be configured such that the first pixel emits a red light, the second pixel emits a green light and the third pixel emits a blue light in the organic EL light-emitting apparatus 1A in the second exemplary embodiment.

The order of laminating the common layer and the non-common layer is not limited to the order exemplarily described in the above exemplary embodiments. For instance, the non-common layer may be provided between the common layer and the anode, or alternatively, may be provided between the common layer and the cathode. For instance, in the organic EL light-emitting apparatus of the first exemplary embodiment, the first emitting layer (non-common layer) of the first pixel may be provided between the electron transporting layer and the common layer, and the third emitting layer (non-common layer) of the third pixel may be provided between the hole transporting layer and the common layer.

The barrier layer may be provided in the organic EL light-emitting apparatus in the embodiments other than the third exemplary embodiment. The barrier layer is provided between the common layer and the non-common layer. For instance, in the organic EL light-emitting apparatus of the first exemplary embodiment, the first barrier layer may be provided between the first emitting layer (non-common layer) of the first pixel and the common layer, and a second barrier layer may be provided between the third emitting layer (non-common layer) of the third pixel and the common layer. In the organic EL light-emitting apparatus having a plurality of barrier layers, compounds contained in the respective barrier layers may be the same or different. The compound(s) contained in the barrier layer(s) are selected as needed depending on the compounds contained in the emitting layer (non-common layer) in contact with the barrier layer(s) and the delayed fluorescent compound contained in the common layer.

Although the above exemplary embodiments with the fluorescent compound contained in the emitting layer (non-common layer) are described as examples, the invention is not limited to the above exemplary embodiments. For instance, the emitting layer (non-common layer) may contain the phosphorescent compound. Since the common layer contains the delayed fluorescent compound, energy transfer is more easily caused from the common layer to the layer containing the phosphorescent compound as compared with a typical organic EL light-emitting apparatus. The phosphorescent compound is a compound capable of emitting light in the triplet state. Examples of the blue emitting phosphorescent compound include metal complexes such as an iridium complex, osmium complex and platinum complex. Examples of the green emitting phosphorescent compound include an iridium complex and terbium complex. Examples of the red emitting phosphorescent compound include metal complexes such as an iridium complex, platinum complex and europium complex. The emitting layer may include the phosphorescent compound and the above host material.

The emittable compound contained in the emitting layer in direct contact with the common layer or in indirect contact with the common layer through the barrier layer may be of the same or different emission type in each of the pixels. For instance, in the organic EL light-emitting apparatus of the first exemplary embodiment, the first emitting layer of the first pixel may contain the phosphorescent compound and the third emitting layer of the third pixel may contain the fluorescent compound. Alternatively, the first emitting layer may contain the fluorescent compound and the third emitting layer may contain the phosphorescent compound.

Moreover, the emitting layer (non-common layer) may contain the delayed fluorescent compound. In this case, the emitting layer more preferably contains the delayed fluorescent compound and the fluorescent compound.

The arrangement of the emitting zone of the organic EL light-emitting apparatus is not limited to the arrangement described in the above exemplary embodiments. For instance, the emitting zone may have arrangements No. 1 to No. 36 shown in Tables 1 to 4.

In Tables 1 to 4, DF represents the delayed fluorescent compound, FL represents the fluorescent compound, and PH represents the phosphorescent compound. The arrangement No. 1 shows that the common layer shared by the first, second and third pixels contains DF+FL, namely, the delayed fluorescent compound and the fluorescent compound. The arrangement No. 1 also shows that the first emitting layer and the third emitting layer contain FL, namely, the fluorescent compound. It should be noted that compounds represented by the same signs may occasionally be different. For instance, in the arrangement No. 1, the fluorescent compound FL contained in the first emitting layer may occasionally be different from the fluorescent compound FL contained in the third emitting layer. In a layer arrangement of each of the pixels, a laminated arrangement is indicated, for instance, by a "common layer/emitting layer" using "/". In the laminated arrangements of Tables 1 to 4, the emitting layer and the barrier layer may be directly laminated, or alternatively, the barrier layer may be interposed between the common layer and the emitting layer.

Although the common layer is exemplified by the "common layer (DF+FL)" in Tables 1 to 4, the invention is not limited thereto. The common layer of the invention may be a "common layer (DF)" in which no fluorescent compound FL is contained.

Further, the first emitting layer and the third emitting layer are respectively exemplified by the "first emitting layer (DF)" and the "third emitting layer (DF)" in Tables 1 to 4, the invention is not limited thereto. The first emitting layer and the third emitting layer of the invention may be a "first emitting layer (DF+FL)" and a "third emitting layer (DF+FL)" in which the fluorescent compound FL is contained.

TABLE 1

| No. | Second Pixel (blue) | First Pixel (green) | Third Pixel (red) |
|---|---|---|---|
| 1 | Common Layer (DF + FL) | Common Layer (DF + FL)/First Emitting Layer (FL) | Common Layer (DF + FL)/Third Emitting Layer (FL) |
| 2 | | | Common Layer (DF + FL)/Third Emitting Layer (PH) |
| 3 | | | Common Layer (DF + FL)/Third Emitting Layer (DF) |
| 4 | | Common Layer (DF + FL)/First Emitting Layer (PH) | Common Layer (DF + FL)/Third Emitting Layer (FL) |
| 5 | | | Common Layer (DF + FL)/Third Emitting Layer (PH) |
| 6 | | | Common Layer (DF + FL)/Third Emitting Layer (DF) |
| 7 | | Common Layer (DF + FL)/First Emitting Layer (DF) | Common Layer (DF + FL)/Third Emitting Layer (FL) |
| 8 | | | Common Layer (DF + FL)/Third Emitting Layer (PH) |
| 9 | | | Common Layer (DF + FL)/Third Emitting Layer (DF) |

TABLE 2

| No. | Third Pixel (blue) | Second Pixel (green) | First Pixel (red) |
|---|---|---|---|
| 10 | Third Emitting Layer (DF) | Common Layer (DF + FL) | Common Layer (DF + FL)/First Emitting Layer (FL) |
| 11 | | | Common Layer (DF + FL)/First Emitting Layer (PH) |
| 12 | | | Common Layer (DF + FL)/First Emitting Layer (DF) |
| 13 | Third Emitting Layer (FL) | | Common Layer (DF + FL)/First Emitting Layer (FL) |
| 14 | | | Common Layer (DF + FL)/First Emitting Layer (PH) |
| 15 | | | Common Layer (DF + FL)/First Emitting Layer (DF) |
| 16 | Third Emitting Layer (PH) | | Common Layer (DF + FL)/First Emitting Layer (FL) |
| 17 | | | Common Layer (DF + FL)/First Emitting Layer (PH) |
| 18 | | | Common Layer (DF + FL)/First Emitting Layer (DF) |

TABLE 3

| No. | Second Pixel (blue) | Third Pixel (green) | First Pixel (red) |
|---|---|---|---|
| 19 | Common Layer (DF + FL) | Third Emitting Layer (DF) | Common Layer (DF + FL)/First Emitting Layer (FL) |
| 20 | | | Common Layer (DF + FL)/First Emitting Layer (PH) |
| 21 | | | Common Layer (DF + FL)/First Emitting Layer (DF) |
| 22 | | Third Emitting Layer (FL) | Common Layer (DF + FL)/First Emitting Layer (FL) |
| 23 | | | Common Layer (DF + FL)/First Emitting Layer (PH) |
| 24 | | | Common Layer (DF + FL)/First Emitting Layer (DF) |
| 25 | | Third Emitting Layer (PH) | Common Layer (DF + FL)/First Emitting Layer (FL) |
| 26 | | | Common Layer (DF + FL)/First Emitting Layer (PH) |
| 27 | | | Common Layer (DF + FL)/First Emitting Layer (DF) |

TABLE 4

| No. | Second Pixel (blue) | First Pixel (green) | Third Pixel (red) |
|---|---|---|---|
| 28 | Common Layer (DF + FL) | Common Layer (DF + FL)/First Emitting Layer (FL) | Third Emitting Layer (DF) |
| 29 | | Common Layer (DF + FL)/First Emitting Layer (PH) | |
| 30 | | Common Layer (DF + FL)/First Emitting Layer (DF) | |
| 31 | | Common Layer (DF + FL)/First Emitting Layer (FL) | Third Emitting Layer (FL) |
| 32 | | Common Layer (DF + FL)/First Emitting Layer (PH) | |
| 33 | | Common Layer (DF + FL)/First Emitting Layer (DF) | |
| 34 | | Common Layer (DF + FL)/First Emitting Layer (FL) | Third Emitting Layer (PH) |
| 35 | | Common Layer (DF + FL)/First Emitting Layer (PH) | |
| 36 | | Common Layer (DF + FL)/First Emitting Layer (DF) | |

The organic EL light-emitting apparatus may include a color converter configured to convert a color of a light radiated from each of the pixels. The color converter is exemplified by a color filter. For instance, when a light emitted from the first pixel is in mixed colors of a light emitted from the common layer and a light emitted from the emitting layer, the color converter provided in the organic EL light-emitting apparatus can also transmit the light emitted from the emitting layer while blocking the light emitted from the common layer.

The emitting layer is not limited to a single layer, but may be provided as laminate by a plurality of emitting layers. When a single pixel has a plurality of emitting layers, at least one of the emitting layers is preferably in direct contact with the common layer or in indirect contact with the common layer through the barrier layer and the like. The plurality of emitting layers contained in the single pixel may be the same or different in the emission type. The plurality of emitting layers contained in the single pixel may be adjacent to each other, or in a so-called tandem-type laminated arrangement in which a plurality of emitting units are laminated through an intermediate layer.

A blocking layer may be provided adjacently between the emitting layer and the electron transporting layer and/or between the emitting layer and the hole transporting layer, in addition to the above-described barrier layer provided between the common layer and the emitting layer. The blocking layer is preferably provided in contact with the emitting layer to block at least ones of holes, electrons and excitons.

For instance, when the emitting layer is provided between the common layer and the hole transporting layer, a first blocking layer is preferably provided between the emitting layer and the hole transporting layer. When the emitting layer is provided between the common layer and the electron transporting layer, a second blocking layer is preferably provided between the emitting layer and the electron transporting layer.

When the organic EL light-emitting apparatus includes the first blocking layer, the first blocking layer transports holes and blocks electrons from entering a layer (e.g., hole transporting layer) near the anode with respect to the first blocking layer.

When the organic EL light-emitting apparatus includes the second blocking layer, the second blocking layer transports electrons and blocks holes from entering a layer (e.g., electron transporting layer) near the cathode with respect to the second blocking layer.

Further, at least one of the first and second blocking layers may be provided adjacently to the emitting layer to prevent an excitation energy from leaking from the emitting layer into a layer in the vicinity thereof. Excitons generated in the emitting layer are prevented from moving into the layer(s) (e.g., the electron transporting layer and the hole transporting layer) provided near the electrode(s) with respect to the blocking layer. The emitting layer is preferably in contact with the blocking layer.

In the organic EL light-emitting apparatus, the pixels may be spaced apart from each other while sharing the common layer so that the pixels can independently emit light. For instance, the anode may be separately provided for each of the pixels, the layer arrangement from the anode to the hole transporting layer or the emitting layer may be separately provided for each of the pixels, the layer arrangement from the electron transporting layer to the cathode may be separately provided for each of the pixels, and the cathode may be separately provided for each of the pixels. An insulating film and the like may be provided in a gap between the separated pixels.

In order to independently drive the pixels of the organic EL light-emitting apparatus, a thin-film transistor configured to drive each of the pixels may be formed on the substrate, further pixel electrodes (anode) corresponding to the respective pixels may be formed on the thin-film transistor, and the above-described layers may be formed on the pixel electrodes.

Although the organic EL light-emitting apparatus in which three or more pixels are provided in parallel is described as an example in the above exemplary embodiments, an organic EL light-emitting apparatus in which two pixels are provided in parallel may be used. Moreover, the organic EL light-emitting apparatus may include a plurality of combinations of two or more pixels. For instance, the organic EL light-emitting apparatus may include a plurality of combinations of three kinds of pixels (i.e., the first pixel, the second pixel and the third pixel).

The organic EL light-emitting apparatus of the invention, which is not limited to the organic EL light-emitting apparatus according to the first exemplary embodiment, is applicable to an electronic device.

Further, the materials and treatments for practicing the invention may be altered to other arrangements and treatments as long as such other arrangements and treatments are compatible with the invention.

EXAMPLES

Examples of the invention will be described below. However, the invention is not limited to Examples.

Compounds used for manufacturing the organic EL light-emitting apparatus will be shown below.

[Formula 4]
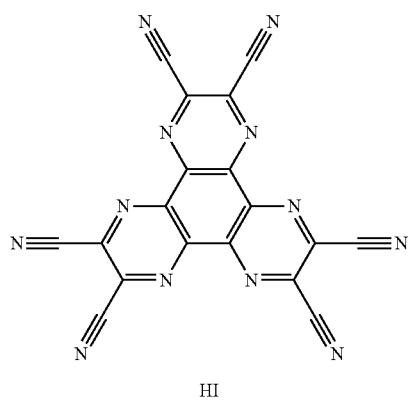
HI
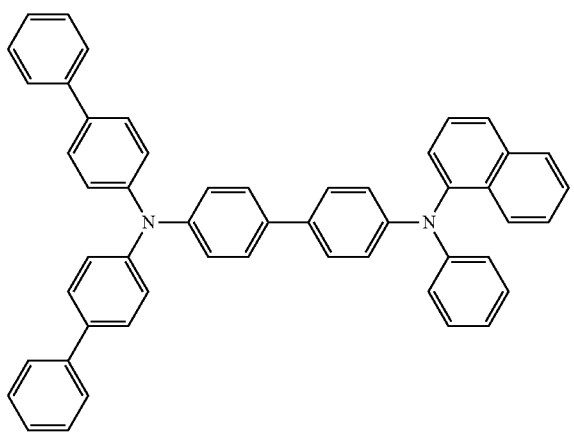
HT1
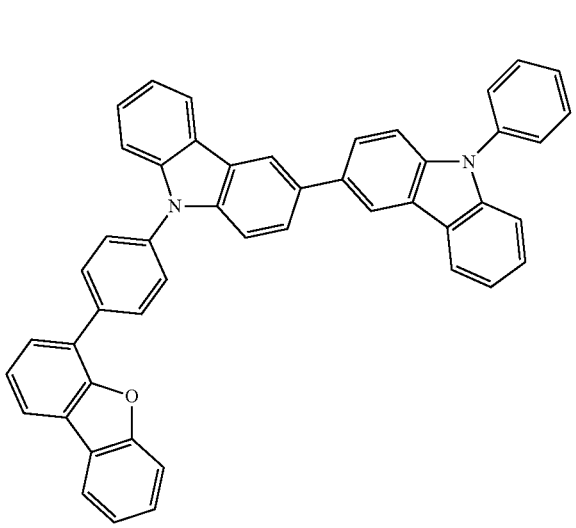
HT2
[Formula 5]
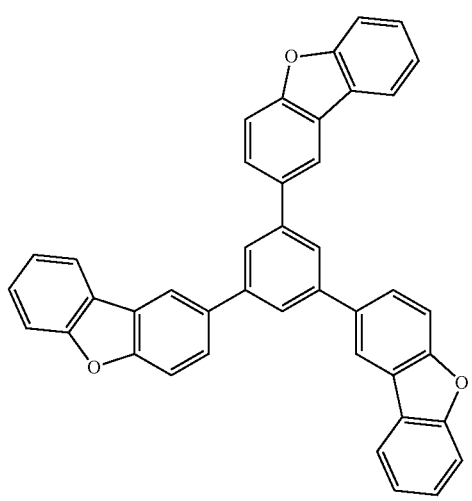
DA
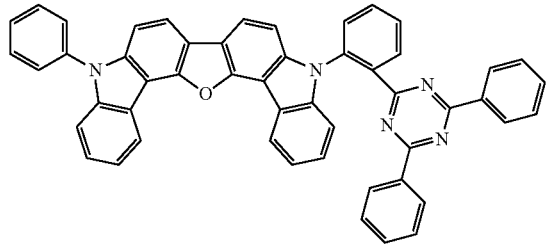
DF
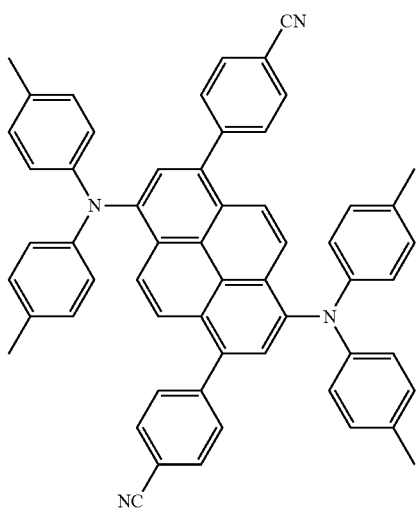
GD

[Formula 6]

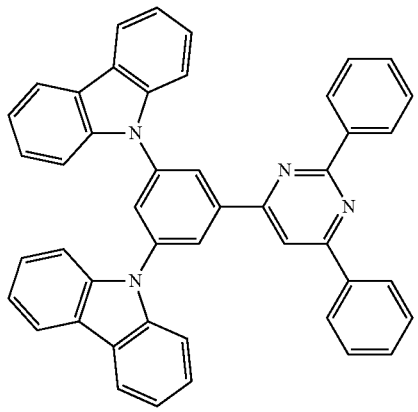

BL

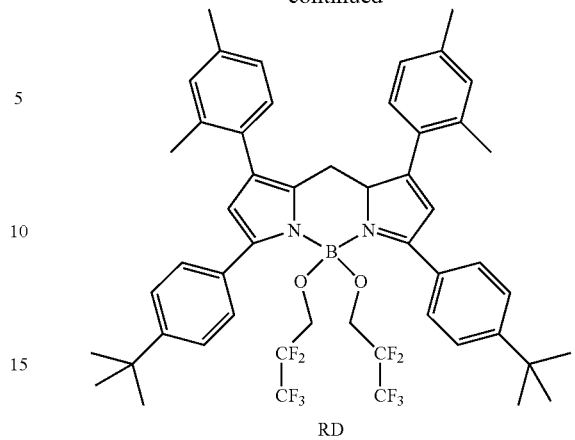

RD

Evaluation of Compounds

Next, properties of the compounds used in Example were measured. A measurement method and a calculation method are shown below.

Delayed Fluorescence

Occurrence of delayed fluorescence was determined by measuring transient photoluminescence (PL) using a device shown in FIG. 2. A sample was prepared by co-depositing the compounds DF and TH-2 on a quartz substrate at a ratio of the compound DF being 12 mass % to form a 100-nm-thick thin film. Emission from the compound DF include: Prompt emission observed immediately when the excited state is achieved by exciting the compound DF with a pulse beam (i.e., a beam emitted from a pulse laser) having an absorbable wavelength; and Delay emission observed not immediately when but after the excited state is achieved. Delayed fluorescence in Examples of the invention means that the amount of Delay emission is 5% or more relative to the amount of Prompt emission.

It has been confirmed that the amount of Delay emission of the compound DF is 5% or more relative to the amount of Prompt emission.

The amount of Prompt emission and the amount of Delay emission can be obtained in the same method as a method described in "Nature 492, 234-238, 2012." The amount of Prompt emission and the amount of Delay emission may be calculated using a device different from ones shown in FIG. 2 and described in Reference Literatures.

Energy at Emission Level

Energy at an emission level of each of the compounds is as follows. The energy at the emission level of each of the compound is measured in accordance with the above-described measurement method of the singlet energy.

Compound DF: 2.73 eV

Compound GD: 2.44 eV

Compound RD: 2.00 eV

Arrangement of Organic EL Light-Emitting Apparatus

An arrangement of the first pixel (R) and the second pixel (G) in the organic EL light-emitting apparatus in each of Examples 1 and 2 is schematically shown in Table 5. In the organic EL light-emitting apparatuses in Examples 1 and 2, the second pixels (G) have the same arrangement. In the organic EL light-emitting apparatuses in Examples 1 and 2, the common layer (G) was provided in a shared manner.

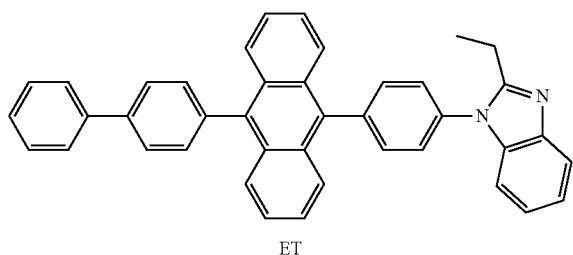

ET

[Formula 7]

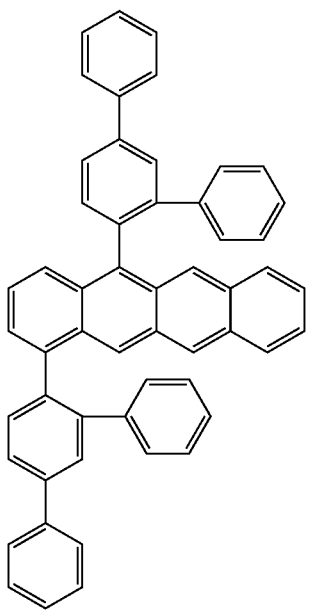

RH

TABLE 5

| Examples 1 and 2 | Example 1 | Example 2 |
|---|---|---|
| Second Pixel (G) | First Pixel (R) | First Pixel (R) |
| Cathode | Cathode | Cathode |
| Electron Injecting Layer | Electron Injecting Layer | Electron Injecting Layer |
| Electron Transporting Layer | Electron Transporting Layer | Electron Transporting Layer |
| Blocking Layer | Blocking Layer | Blocking Layer |
| Common Layer (G) | Common Layer (G) | Common Layer (G) |
| Second Hole Transporting Layer | First Emitting Layer (R) | Barrier Layer |
|  |  | First Emitting Layer (R) |
|  | Second Hole Transporting Layer | Second Hole Transporting Layer |
| First Hole Transporting Layer | First Hole Transporting Layer | First Hole Transporting Layer |
| Hole Injecting Layer | Hole Injecting Layer | Hole Injecting Layer |
| Anode | Anode | Anode |

An arrangement of the pixel (R) in the organic EL light-emitting apparatus in Comparative 1 is schematically shown in Table 6. In the organic EL light-emitting apparatus in Comparative 1, the common layer in which the compound DF is not contained is provided.

TABLE 6

| Comparative 1 |
|---|
| First Pixel (R) |
| Cathode |
| Electron Injecting Layer |
| Electron Transporting Layer |
| Blocking Layer |
| Common Layer (G) |
| First Emitting Layer (R) |
| Second Hole Transporting Layer |
| First Hole Transporting Layer |
| Hole Injecting Layer |
| Anode |

Manufacturing of Organic EL Light-Emitting Apparatus

The organic EL light-emitting apparatus was manufactured in the following manner.

Example 1

A glass substrate (size: 25 mm×75 mm×1.1 mm thick, manufactured by Geomatec Co., Ltd.) having an ITO transparent electrode (anode) was ultrasonic-cleaned in isopropyl alcohol for five minutes, and then UV/ozone-cleaned for 30 minutes. A film of ITO was 130 nm thick.

After the glass substrate having the transparent electrode line was cleaned, the glass substrate was mounted on a substrate holder of a vacuum vapor deposition apparatus. Firstly, the compound HI was deposited on a surface of the glass substrate where the transparent electrode line was provided in a manner to cover the transparent electrode, thereby forming a hole injecting layer (HI film) of each of the first pixel (R) and the second pixel (G). A film thickness of the hole injecting layer was 5 nm.

Subsequently, a compound HT1 was deposited on the hole injecting layer (HI film) to form a first hole transporting layer of each of the first pixel (R) and the second pixel (G). A film thickness of the first hole transporting layer was 80 nm.

Next, a compound HT2 was deposited on the first hole transporting layer of the second pixel (G) to form a second hole transporting layer of the second pixel (G). A film thickness of the second hole transporting layer was 10 nm.

The compound HT2 was also deposited on the first hole transporting layer of the first pixel (R) to form a second hole transporting layer of the first pixel (R). A film thickness of the second hole transporting layer was 5 nm. Further, a compound RH and a compound RD were co-deposited on the second hole transporting layer of the first pixel (R) to form a first emitting layer (R). A film thickness of the first emitting layer (R) was 5 nm. A concentration of the compound RD in the first emitting layer (R) was 1 mass %.

Subsequently, a compound DA, the compound DF and the compound GD were simultaneously co-deposited on the second hole transporting layer of the second pixel (G) and the first emitting layer (R) of the first pixel (R), thereby forming the common layer (G) in a manner to be shared by the first pixel (R) and the second pixel (G). In the common layer (G), a concentration of the compound DF was set to be 50 mass % and a concentration of the compound GD was set to be 1 mass %. A film thickness of the common layer (G) was 5 nm.

Next, a compound BL was deposited on the common layer (G) of the first pixel (R) and the second pixel (G) to form a 5-nm thick blocking layer.

Next, a compound ET was deposited on the blocking layer of each of the first pixel (R) and the second pixel (G) to form a 20-nm thick electron transporting layer.

Subsequently, lithium fluoride (LiF) was deposited on the electron transporting layer of each of the first pixel (R) and the second pixel (G) to form a 1-nm thick electron injecting layer.

Then, metal aluminum (Al) was deposited on the electron injecting layer of each of the first pixel (R) and the second pixel (G) to form an 80-nm thick electron cathode.

An arrangement of the organic EL light-emitting apparatus in Example 1 is shown in symbols as follows.

First Pixel (R):ITO(130)/HI(5)/HT1(80)/HT2(5)/RH:RD (5,RD:1%)/DA:DF:GD(5, DF:50%, GD:1%)/BL(5)/ET (20)/LiF(1)/Al(80) Second Pixel (G):ITO(130)/HI(5)/HT1 (80)/HT2(10)/DA:DF:GD(5, DF:50%, GD: 1%)/BL(5)/ET (20)/LiF(1)/Al(80)

Numerals in parentheses represent a film thickness (unit: nm). The numerals represented by percentage in parentheses indicate a ratio (mass %) of the compounds contained in the layers.

Example 2

In the organic EL light-emitting apparatus in Example 2, the second pixel (G) is the same as that in Example 1 and the first pixel (R) is different from that in Example 1 in the following point.

The compound HT2 was deposited on the first emitting layer (R) of the first pixel (R) to form a barrier layer. A film thickness of the barrier layer was 1 nm.

An arrangement of layers from the common layer (G) to the cathode laminated on the barrier layer is the same as the arrangement of the first pixel (R) in Example 1.

An arrangement of the first pixel (R) in the organic EL light-emitting apparatus in Example 2 is shown in symbols as follows.

First Pixel (R):ITO(130)/HI(5)/HT1(80)/HT2(5)/RH:RD (5,RD:1%)/HT2(1)/DA:DF:GD(5, DF:50%, GD:1%)/BL (5)/ET(20)/LiF(1)/Al(80)

Comparative 1

An organic EL light-emitting apparatus in Comparative 1 is different from the organic EL light-emitting apparatus in Example 1 in that the compound DF is not contained in the common layer (G) in the first pixel (R) and the second pixel (G) is not provided.

An arrangement of the organic EL light-emitting apparatus in Comparative 1 is shown in symbols as follows.

First Pixel (R):ITO(130)/HI(5)/HT1(80)/HT2(5)/RH:RD(5,RD:1%)/DA:GD(5,GD:1%)/BL(5)/ET(20)/LiF(1)/Al(80)

Evaluation of Organic EL Light-Emitting Apparatus

The organic EL devices manufactured in Examples 1 to 2 and Comparative 1 were evaluated as follows. The evaluation results are shown in Table 7.

Luminance-Current Efficiency (L/J)

Voltage was applied on each of the manufactured organic EL light-emitting apparatuses such that the current density was 10 mA/cm$^2$, where luminance L(unit: cd/m$^2$) at that time was measured using a spectroradiometer (manufactured by Konica Minolta, Inc., product name: CS-1000).

A luminance-current efficiency (unit: cd/A) relative to the obtained luminance was calculated. It should be noted that Table 7 shows values relative to the luminance-current efficiency in Comparative 1 being defined as 1.

Peak Wavelength $\lambda_p$

A peak wavelength $\lambda_p$ was calculated based on the obtained spectral-radiance spectra.

A peak wavelength $\lambda_p(R)$ from the first pixel (R) was 620 nm. A peak wavelength $\lambda_p(G)$ from the second pixel (G) was 532 nm.

TABLE 7

|  | Common Layer | L/J (relative value) | $\lambda p$ (G) (nm) | $\lambda p$ (R) (nm) |
| --- | --- | --- | --- | --- |
| Example 1 | DF contained | 2.2 | 532 | 620 |
| Example 2 | DF contained | 2.3 | 532 | 620 |
| Comparative 1 | DF not contained | 1 | 532 | 620 |

According to the organic EL light-emitting apparatuses of Examples 1 and 2 including the common layer containing the delayed fluorescent compound, the luminance-current efficiency was improved by 2.2 times to 2.3 times as much as the organic EL light-emitting apparatus of Comparative 1 in which the common layer does not contain the compound DF. Particularly in Example 2, since the barrier layer is interposed between the common layer and the emitting layer, the luminance-current efficiency (L/J) was more improved than in Example 1.

The invention claimed is:

1. An organic EL light-emitting apparatus, comprising a plurality of pixels comprising a first pixel and a second pixel, wherein:
the first pixel and the second pixel each comprise a common layer in a shared manner;
a pixel(s) other than the second pixel comprises a non-common layer;
the common layer comprises a delayed fluorescent compound;
the common layer further comprises a fluorescent compound;
a singlet energy of the delayed fluorescent compound is larger than a singlet energy of the fluorescent compound contained in the common layer;
the second pixel is configured to emit light from the common layer;
the pixel(s) other than the second pixel is configured to emit light from the non-common layer;
the first pixel comprises: a first emitting layer as the non-common layer; and a barrier layer interposed between the first emitting layer and the common layer; and
a singlet energy of a compound contained in the barrier layer is equal to or larger than a singlet energy of a second fluorescent compound contained in the first emitting layer; and
an energy gap at 77K of a compound contained in the barrier layer is larger than an energy gap at 77K of the delayed fluorescent compound.

2. The organic EL light-emitting apparatus according to claim 1, wherein a peak wavelength of the light emitted from the common layer is smaller than a peak wavelength of the light emitted from the non-common layer.

3. The organic EL light-emitting apparatus according to claim 1, wherein an energy at an emission level of the delayed fluorescent compound is larger than an energy at an emission level of a compound contained in the non-common layer.

4. The organic EL light-emitting apparatus according to claim 1, wherein:
the first pixel is configured to emit a red light; and
the second pixel is configured to emit a green light.

5. The organic EL light-emitting apparatus according to claim 1, wherein:
the first pixel is configured to emit a red light or a green light; and
the second pixel is configured to emit a blue light.

6. The organic EL light-emitting apparatus according to claim 1, further comprising a third pixel, wherein:
the common layer is shared by the first pixel, the second pixel and the third pixel or the common layer is shared by the first pixel and the second pixel;
the first pixel comprises a first emitting layer as the non-common layer;
the first pixel is configured to emit a light from the first emitting layer;
the third pixel comprises a third emitting layer as the non-common layer; and
the third pixel is configured to emit a light from the third emitting layer.

7. The organic EL light-emitting apparatus according to claim 6, wherein the third pixel comprises a third fluorescent compound.

8. The organic EL light-emitting apparatus according to claim 6, wherein:
the first pixel is configured to emit a red light;
the second pixel is configured to emit a blue light; and
the third pixel is configured to emit a green light.

9. The organic EL light-emitting apparatus according to claim 1, wherein each of the plurality of pixels comprising the first pixel and the second pixel comprises:
an anode; and
a hole transporting layer provided between the anode and the common layer.

10. The organic EL light-emitting apparatus according to claim 1, wherein each of the plurality of pixels comprising the first pixel and the second pixel comprises:
a cathode; and
an electron transporting layer provided between the cathode and the common layer.

11. An electronic device, comprising the organic EL light-emitting apparatus according to claim 1.

12. The organic EL light-emitting apparatus according to claim 1, wherein the common layer further comprises a third compound.

13. The organic EL light-emitting apparatus according to claim 12, wherein a singlet energy of the third compound is larger than the singlet energy of the delayed fluorescent compound.

14. The organic EL light-emitting apparatus according to claim 6, wherein the third pixel is not in contact with the common layer.

15. The organic EL light-emitting apparatus according to claim 6, wherein an energy at an emission level of the delayed fluorescent compound is larger than an energy at an emission level of a compound contained in the third emitting layer.

16. The organic EL light-emitting apparatus according to claim 6, wherein a peak wavelength of the emission from the common layer is smaller than a peak wavelength of the emission from the third emitting layer.

* * * * *